(12) United States Patent
Mitani et al.

(10) Patent No.: US 7,935,973 B2
(45) Date of Patent: May 3, 2011

(54) LIGHT-EMITTING DIODE, LIGHT-EMITTING DIODE SUBSTRATE AND PRODUCTION METHOD OF LIGHT-EMITTING DIODE

(75) Inventors: Atsuyuki Mitani, Ube (JP); Shin-ichi Sakata, Ube (JP); Itsuhiro Fujii, Ube (JP)

(73) Assignee: Ube Industries, Ltd. (JP)

( * ) Notice: Subject to any disclaimer, the term of this patent is extended or adjusted under 35 U.S.C. 154(b) by 457 days.

(21) Appl. No.: 11/665,984

(22) PCT Filed: Oct. 20, 2005

(86) PCT No.: PCT/JP2005/019739
§ 371 (c)(1),
(2), (4) Date: Apr. 20, 2007

(87) PCT Pub. No.: WO2006/043719
PCT Pub. Date: Apr. 27, 2006

(65) Prior Publication Data
US 2008/0283853 A1    Nov. 20, 2008

(30) Foreign Application Priority Data

Oct. 21, 2004 (JP) ................................ 2004-307337

(51) Int. Cl.
*H01L 33/00* (2010.01)
(52) U.S. Cl. .................................. 257/96; 257/E33.067
(58) Field of Classification Search .................. 257/94, 257/96, E33.032, E33.067, 98, 99, 103, E33.023; 438/29
See application file for complete search history.

(56) References Cited

U.S. PATENT DOCUMENTS 5,484,752 A   1/1996   Waku et al.
(Continued)

FOREIGN PATENT DOCUMENTS

EP    1 588 991 A1    10/2005
(Continued)

OTHER PUBLICATIONS

Triplicane A. Parthasarathy et al., "Deformation Behavior of an $Al_2O_3$-$Y_3Al_5O_{12}$ Eutectic Composite in Comparison with Sapphire and YAG", Journal of the American Ceramic Society, vol. 76, 1993, pp. 29-32.

(Continued)

*Primary Examiner* — Thomas L Dickey
*Assistant Examiner* — Fazli Erdem
(74) *Attorney, Agent, or Firm* — DLA Piper LLP (US)

(57) ABSTRACT

The light-emitting diode is a light-emitting diode including a light-converting material substrate and a semiconductor layer formed on the light-converting material substrate, wherein the light-converting material substrate includes a solidified body in which at least two or more oxide phases selected from a simple oxide and a complex oxide are formed continuously and three-dimensionally entangled with each other, at least one oxide phase in the solidified body comprises a metal element capable of emitting fluorescence, and the semiconductor layer includes a plurality of compound semiconductor layers and has at least a light-emitting layer capable of emitting visible light. A light-emitting diode substrate forms a semiconductor, ensuring that the crystal-structure matching with a semiconductor for the formation of a light-emitting diode is good, a good semiconductor layer with less defects can be formed, good-efficiency light emission can be obtained from a light-emitting layer formed in the semiconductor layer, uniform florescence can be emitted by light from the light-emitting layer in the semiconductor layer, and light can be efficiently out put; and a color unevenness-free light-emitting diode using the substrate.

11 Claims, 3 Drawing Sheets

U.S. PATENT DOCUMENTS

| | | | |
|---|---|---|---|
| 5,569,547 A | 10/1996 | Waku et al. | |
| 5,902,963 A | 5/1999 | Chappaz et al. | |
| 5,981,415 A * | 11/1999 | Waku et al. | 501/80 |
| 5,998,925 A * | 12/1999 | Shimizu et al. | 313/503 |
| 2004/0145308 A1 | 7/2004 | Rossner et al. | |
| 2005/0087753 A1* | 4/2005 | D'Evelyn et al. | 257/98 |
| 2005/0269582 A1* | 12/2005 | Mueller et al. | 257/94 |

FOREIGN PATENT DOCUMENTS

| | | |
|---|---|---|
| JP | 07-149597 A | 6/1995 |
| JP | 07-187893 | 7/1995 |
| JP | 08-081257 | 3/1996 |
| JP | 08-253389 | 10/1996 |
| JP | 08-253390 | 10/1996 |
| JP | 09-067194 | 3/1997 |
| JP | 10-017396 A | 1/1998 |
| JP | 2000-208815 A | 7/2000 |
| JP | 2002-141559 A | 5/2002 |
| JP | 2003-204080 A | 7/2003 |
| JP | 2004-146835 A | 5/2004 |
| WO | 2004/005216 A1 | 1/2004 |
| WO | 2004/065324 A | 8/2004 |

OTHER PUBLICATIONS

Ryo Murota et al., *"Solid State Light Source Fabricated with YAG:Ce Single Crystal"*, Jpn. J. Appl. Phys., vol. 41 (2002), Part 2, No. 8A, pp. L 887-L888.

Shuji Nakamura et al., "High-Brightness InGaN Blue, Green and Yellow Light-Emitting Diodes with Quantum Well Structures," Jpn. J. Appl. Phys. vol. 34 (1995) pp. L 797-L 799, Part 2, No. 7A.

\* cited by examiner

Al₂O₃

Y₃Al₅O₁₂:Ce

LIGHT-EMITTING DIODE, LIGHT-EMITTING DIODE SUBSTRATE AND PRODUCTION METHOD OF LIGHT-EMITTING DIODE

RELATED APPLICATION

This is a §371 of International Application No. PCT/JP2005/019739, with an International Filing date of Oct. 20, 2005 (WO 2006/043719 A1), published Apr. 27, 2006, which is based on Japanese Patent Application No. 2004-307337, filed Oct. 21, 2004.

TECHNICAL FIELD

The technology we describe relates to a light-emitting diode usable for displays, lighting, backlight sources and the like, more specifically, to a light-emitting diode using a light-converting material capable of emitting fluorescence, and a substrate for forming a light-emitting diode.

BACKGROUND ART

In recent years, studies are being aggressively conducted to develop a white light-emitting diode with the light-emitting source being a blue light-emitting element using a nitride-based compound semiconductor ($In_xAl_yGa_{1-x-y}N$, wherein $0 \leq x \leq 1$, $0 \leq y \leq 1$ and $0 \leq x+y \leq 1$). The white light-emitting diode is lightweight, does not use mercury and has long life, and therefore, demands are expected to expand in the future. A most commonly employed method for converting blue light of a blue light-emitting diode into white light is a method where, as described, for example, in Japanese Unexamined Patent Publication (Kokai) No. 2000-208815, a coating layer containing a fluorescent material capable of absorbing a part of blue light and emitting yellow light and a mold layer for mixing blue light of the light source and yellow light from the coating layer are provided on the front surface of a light-emitting element which emits blue light and a pseudo-white color is obtained by mixing the blue color and the yellow color which are in a complementary colors relationship with each other. As for the coating layer, a mixture of a cerium-activated YAG ($Y_3Al_5O_{12}$:Ce) powder and an epoxy resin has been conventionally employed. However, in this method, for example, uneven distribution of the fluorescent powder contained or a fluctuation in the amount of fluorescent powder among individual light-emitting diodes readily occurs when applying the coating layer, and color unevenness is a problem.

In order to avoid this problem, Japanese Unexamined Patent Publication (Kokai) No. 2003-204080 has proposed a method of forming a nitride semiconductor layer comprising $In_xAl_yGa_{1-x-y}N$ (wherein $0 \leq x \leq 1$, $0 \leq y \leq 1$ and $0 \leq x+y \leq 1$) on a substrate of which main plane is the (111) plane of $Y_3Al_5O_{12}$:Ce fluorescent material single crystal, causing blue light emitted from the light-emitting layer to be incident directly on the substrate, and emitting homogeneous yellow fluorescence from the substrate itself, whereby a homogeneous white color free of color unevenness is obtained only by a light-emitting chip without using a fluorescent powder-containing coating layer (see, FIG. 2).

However, in the method described in Japanese Unexamined Patent Publication (Kokai) No. 2003-204080, the difference in the lattice spacing between the $Y_3Al_5O_{12}$ (111) substrate and $In_xGa_{1-x}N$ of the nitride semiconductor buffer layer formed thereon is still a value larger than the difference in the lattice spacing between the $Al_2O_3$ single crystal (0001) plane (hexagonal notation, hereinafter the same) substrate in the method commonly employed at present and, for example, a GaN buffer layer. Therefore, a larger number of distortions are generated in the nitride semiconductor layer of this method than in the layer formed by the method employed at present, and a good-quality nitride semiconductor light-emitting layer and in turn, a good light-emitting diode is difficult to obtain.

| Crystal | Lattice Spacing |
|---|---|
| $In_xGa_{1-x}N$ | 3.19 Å to 3.53 Å |
| $Y_3Al_5O_{12}$ | 8.5 Å (on (111) plane) |
| GaN | 3.19 Å |
| $Al_2O_3$ | 2.74 Å (on (0001) plane) |

Considering the method commonly employed at present for producing a nitride semiconductor layer, use of the $Al_2O_3$ single crystal (0001) plane having a narrower lattice spacing than the YAG single crystal (111) plane is apparently preferred in order to obtain a good-quality nitride semiconductor layer. However, when an $Al_2O_3$ single crystal is used, a yellow fluorescence cannot be obtained and the above-described coating layer becomes necessary, giving rise to a problem such as color unevenness.

Also, in the single crystal $Y_3Al_5O_{12}$:Ce fluorescent material substrate used for the method of Japanese Unexamined Patent Publication (Kokai) No. 2003-204080, the inside is homogeneous to allow light to go straight but not be refracted, reflected or scattered and therefore, as described in *Jpn. J. Appl. Phys.*, Vol. 41, pp. L887-L888 (2002), light entered has a high probability of repeating total reflection at the interface (hereinafter referred to as an "inside surface") between the substrate and the outer material (e.g., air, resin) and attenuating without going outside, as a result, good light out put efficiency cannot be obtained.

It could therefore be advantageous to provide a light-emitting diode substrate for forming a semiconductor, ensuring that the crystal-structure matching a semiconductor for the formation of a light-emitting diode is good, a good semiconductor layer with less defects can be formed, good-efficiency light emission can be obtained from a light-emitting layer formed in the semiconductor layer, uniform florescence can be emitted by light from the light-emitting layer in the semiconductor layer, and the light can be efficiently out put. It could also be advantageous to provide a color unevenness-free light-emitting diode using the substrate.

SUMMARY

We found that when a light-converting material substrate comprising a ceramic composite oxide is used, this substrate can act as a substrate for the formation of a semiconductor layer for light-emitting diodes and at the same time, can establish fluorescence emission by which the light can also be efficiently out put. Thus, we provide a light-emitting diode comprising a light-converting material substrate and a semiconductor layer formed on the light-converting material substrate, wherein the light-converting material substrate comprises a solidified body in which at least two or more oxide phases selected from a simple oxide and a complex oxide are formed to be continuously and three-dimensionally entangled with each other, at least one oxide phase in the solidified body comprises a metal element capable of emitting fluorescence, and the semiconductor layer comprises a plurality of compound semiconductor layers and has at least a light-emitting layer capable of emitting visible light.

In one aspect of the light-emitting diode, the semiconductor layer is a nitride semiconductor layer and it is preferred that the plurality of compound semiconductor layers are nitride-based compound semiconductor layers represented by the formula: $In_xAl_yGa_{1-x-y}N$ (wherein $0 \leq x \leq 1$, $0 \leq y \leq 1$ and $0 \leq x+y \leq 1$), at least one oxide phase in the solidified body is an $Al_2O_3$ crystal phase and the main plane of the light-converting material substrate is the (0001) plane of the $Al_2O_3$ crystal.

In one aspect of the light-emitting diode, the light-converting material substrate comprises at least a cerium-activated crystal having a garnet-type structure, and preferably comprises a $Y_3Al_5O_{12}$ crystal.

In one aspect of the light-emitting diode, the light-emitting layer formed in the nitride semiconductor layer emits a violet or blue color and the light-emitting layer preferably comprises In—Ga—N.

Also, we provide a light-emitting diode substrate for the formation of a semiconductor layer for light-emitting diodes, comprising a solidified body in which at least two or more oxide phases selected from a simple oxide and a complex oxide are formed continuously and three-dimensionally entangled with each other, wherein at least one oxide phase in the solidified body comprises a metal element capable of emitting fluorescence.

Furthermore, we provide a method for producing a light-emitting diode, comprising forming a semiconductor layer comprising a plurality of compound semiconductor layers and having at least a light-emitting layer capable of emitting visible light, on the above-described light-emitting diode substrate.

DETAILED DESCRIPTION

The light-emitting diode is described in detail below.

Figure 1:
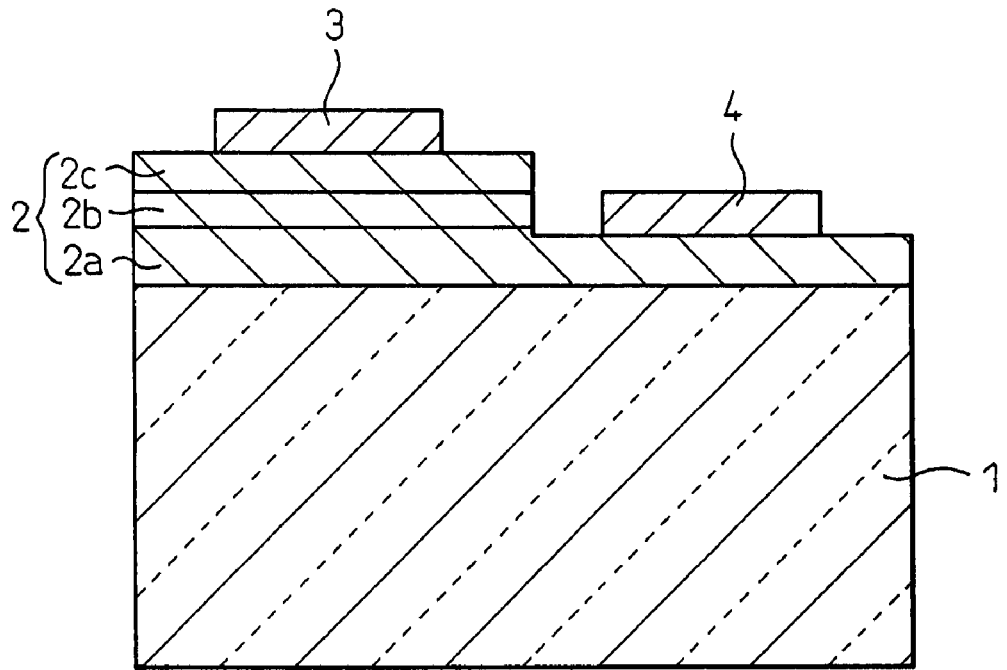
FIG. 1 is a schematic cross-sectional view showing one embodiment of the light-emitting diode.
Figure 2:
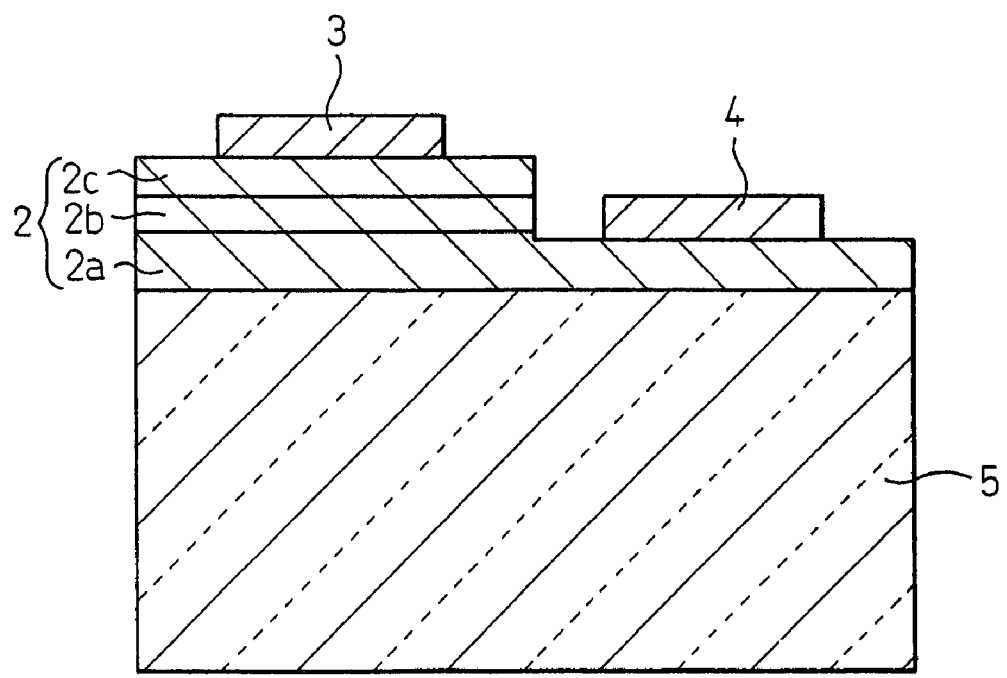
FIG. 2 is a schematic cross-sectional view showing the structure of a conventional light-emitting diode.

The light-emitting diode comprises, for example, as shown in FIG. 1, a light-converting material substrate 1 and a semiconductor layer 2 formed thereon. In the embodiment of FIG. 1, a nitride semiconductor layer 2 comprising a plurality of nitride-based compound semiconductor layers 2a to 2c and having at least a light-emitting layer capable of emitting visible light is formed on an $Al_2O_3$/YAG:Ce light-converting material substrate 1, and a p-electrode 3 and an n-electrode 4 are formed thereon.

The light-converting material substrate is a light-emitting diode substrate for the formation of a compound semiconductor layer for light-emitting diodes, comprising a solidified body in which at least two or more oxide phases selected from a simple oxide and a complex oxide are formed to be continuously and three-dimensionally entangled with each other, wherein at least one oxide phase in the solidified body is an $Al_2O_3$ crystal phase and at least one oxide phase in the solidified body comprises a metal element capable of emitting fluorescence. The simple oxide means an oxide of one kind of metal and the complex oxide means an oxide of two or more kinds of metals. Each oxide forms a structure of single crystals being three-dimensionally entangled with each other. Examples of the simple oxide include aluminum oxide ($Al_2O_3$), zirconium oxide ($ZrO_2$), magnesium oxide (MgO), silicon oxide ($SiO_2$), titanium oxide ($TiO_2$), barium oxide (BaO), beryllium oxide (BeO), calcium oxide (CaO), chromium oxide ($Cr_2O_3$) and rare earth element oxides ($La_2O_3$, $Y_2O_3$, $CeO_2$, $Pr_6O_{11}$, $Nd_2O_3$, $Sm_2O_3$, $Gd_2O_3$, $Eu_2O_3$, $Tb_4O_7$, $Dy_2O_3$, $Ho_2O_3$, $Er_2O_3$, $Tm_2O_3$, $Yb_2O_3$, $Lu_2O_3$). Examples of the complex oxide include $LaAlO_3$, $CeAlO_3$, $PrAlO_3$, $NdAlO_3$, $SmAlO_3$, $EuAlO_3$, $GdAlO_3$, $DyAlO_3$, $ErAlO_3$, $Yb_4Al_2O_9$, $Y_3Al_5O_{12}$, $Er_3Al_5O_{12}$, $Tb_3Al_5O_{12}$, $11Al_2O_3 \cdot La_2O_3$, $11Al_2O_3 \cdot Nd_2O_3$, $3Dy_2O_3 \cdot 5Al_2O_3$, $2Dy_2O_3 \cdot Al_2O_3$, $11Al_2O_3 \cdot Pr_2O_3$, $EuAl_{11}O_{18}$, $2Gd_2O_3 \cdot Al_2O_3$, $11Al_2O_3 \cdot Sm_2O_3$, $Yb_3Al_5O_{12}$, $CeAl_{11}O_{18}$ and $Er_4Al_2O_9$.

The light-converting material substrate, which is the light-emitting diode substrate, comprises two or more kinds of oxide phases, and therefore various crystal lattice spacings can be selected by the combination of oxide phases. In turn, the substrate can be matched with the lattice spacing of various semiconductors for light-emitting diodes, so that a good semiconductor layer assured of high matching property in view of crystal structure and less defects can be formed and good-efficient light emission can be obtained from the light-emitting layer formed in the semiconductor layer. Furthermore, the light-converting material substrate is a fluorescent material, and therefore uniform fluorescence can be emitted by light from the light-emitting layer in the semiconductor layer. Also, individual oxide phases are different in the refractive index, and therefore light is refracted and reflected in various directions at the interface between oxide phases and scarcely total-reflection, occurs at the inside surface of the substrate, as a result, good light out-put efficiency can also be obtained.

In the case where the semiconductor layer for light-emitting diodes is a nitride semiconductor layer, with respect to the solidified body constituting the light-converting material, a preferred solidified body is a combination containing an $Al_2O_3$ crystal, which is a simple oxide, because, as described above, the $Al_2O_3$ crystal has good crystal-structure matching with the InGaN representative of the material constituting the nitride semiconductor layer capable of emitting visible light, and a good nitride semiconductor light-emitting layer can be formed. A more preferred solidified body is a combination of an $Al_2O_3$ crystal with at least a single crystal of a cerium-activated garnet-type crystal, which is a complex oxide. The garnet-type crystal is represented by the structural formula: $A_3X_5O_{12}$, and it is particularly preferred that A in the structural formula contains one or more elements selected from the group consisting of Y, Tb, Sm, Gd, La and Er, and X in the structural formula contains one or more elements selected from Al and Ga, because the light-converting material comprising this particularly preferred combination absorbs a part of violet to blue light while transmitting light and emits yellow fluorescence. Above all, a combination with a cerium-activated $Y_3Al_5O_{12}$ (=YAG:Ce) ensures emission of strong fluorescence and is suitable. In this light-converting material where the refractive index of YAG:Ce is 1.85 and the refractive index of $Al_2O_3$ is 1.78, the average refractive index is lower than the refractive index of the YAG:Ce single crystal and therefore, total reflection at the inside surface of the substrate scarcely occurs. In addition, by virtue of the complicated-shape interface of the two phases differing in the refractive index, which is formed by having a structure that the phases are complicatedly entangled with each other, light is refracted and reflected in various directions within the material to make more difficult the occurrence of total reflection at the surface and this is advantageous for bringing out good light out-put efficiency.

The $Al_2O_3$/YAG:Ce light-converting material substrate shown in FIG. 1, which represents one aspect, comprises an $Al_2O_3$ single crystal and a YAG:Ce single crystal, where the oxide phases are formed continuously and three-dimensionally entangled with each other, and the are composed of two single crystal phases. It is very important that each phase is a single crystal. If the phase is not a single crystal, a good-quality nitride semiconductor layer cannot be formed. The light-converting material substrate is obtained, for example, by cutting the $Al_2O_3$/YAG:Ce solidified body to a predetermined thickness, polishing the surface to give a predetermined state, and washing it. The light-converting material substrate is preferably cut with an orientation such that the (0001) plane of $Al_2O_3$ becomes the main plane. Since $Al_2O_3$ has a crystal structure analogous to that of $In_xAl_yGa_{1-x-y}N$, which is a nitride-based compound semiconductor, the difference in the lattice spacing between the $Al_2O_3$ (0001) plane and the $In_xAl_yGa_{1-x-y}N$ is small and matching is good. Accordingly, by using the (0001) plane of $Al_2O_3$, a good-quality nitride semiconductor layer can be obtained and a good light-emitting layer can be formed.

The solidified body constituting the light-converting material can be obtained by melting raw material oxides and then solidifying the melt. The solidified body may be obtained, for example, by a simple and easy method of charging the melt into a crucible kept at a predetermined temperature and then solidifying it while controlling the cooling temperature, but the solidified body is most preferably produced by a unidirectional solidification method, because when unidirectional solidification is performed, the crystal phase contained continuously grows into a single crystal state and the phases come to have a single crystal orientation.

The light-converting material is the same as the ceramic composite materials disclosed, for example, in Japanese Unexamined Patent Publication (Kokai) Nos. 7-149597, 7-187893, 8-81257, 8-253389, 8-253390 and 9-67194 previously filed by the applicants and their corresponding U.S. applications (U.S. Pat. Nos. 5,569,547, 5,484,752 and 5,902, 963) except that at least one phase contains a metal element capable of emitting fluorescence, and the light-converting material can be produced by the production methods disclosed in these patent applications (patents). The contents disclosed in these patent applications and patents are incorporated herein by reference.

The nitride semiconductor layer formed on the light-converting material substrate comprises a plurality of nitride-based compound semiconductor layers. The plurality of nitride-based compound semiconductor layers each is preferably composed of a nitride-based compound represented by the formula: $In_xAl_yGa_{1-x-y}N$ (wherein $0 \leq x \leq 1$, $0 \leq y \leq 1$ and $0 \leq x+y \leq 1$). The nitride semiconductor layer has at least a light-emitting layer capable of emitting visible light. In order to form a good light-emitting layer, a plurality of nitride-based compound semiconductor layers where the composition of each layer is adjusted to be optimal for each function are preferably stacked. The plurality of nitride-based compound semiconductor layers and the method for forming these layers are known techniques as disclosed, for example, in *Jpn. J. Appl. Phys.*, Vol. 34, L798 (1995). Specifically, a GaN buffer layer, an n-type GaN:Si contact layer on which an n-electrode is formed, an n-type $Al_{0.5}Ga_{0.9}N$:Si layer, an n-type $In_{0.05}Ga_{0.95}N$:Si layer, an In—Ga—N layer which forms a single quantum well structure-type light-emitting layer, a p-type $Al_{0.1}Ga_{0.9}N$:Mg barrier layer, and a p-type GaN:Mg layer on which a p-electrode is formed, are sequentially stacked on a substrate by MOCVD or the like, whereby the plurality of nitride-based compound semiconductor layers can be obtained. The structure of the light-emitting layer may be a multiple quantum well structure other than the single quantum well structure or may be a homo-structure, a hetero-structure or a double hetero-structure.

The light-emitting layer in the nitride semiconductor layer preferably emits visible light. On passing of visible light through the light-converting substrate of the present invention, florescence resulting from wavelength conversion and visible light before conversion are mixed and new pseudo-light can be obtained according to the wavelength of the mixed light. Furthermore, the visible light preferably emits a blue or violet color. In the case where the emission color is blue or violet, when the blue or violet light from the light-emitting layer is incident on the substrate YAG:Ce single crystal, yellow fluorescence is generated from the YAG:Ce crystal and the blue or violet light transmits directly through the $Al_2O_3$ crystal. These light rays are mixed by the continuous and three-dimensionally entangled texture in the light-converting material single crystal substrate and emitted, so that homogeneous white color free of color unevenness can be obtained. In this respect, the light-emitting layer in the nitride semiconductor layer preferably comprises $In_xGa_{1-x}N$ (wherein $0 \leq x \leq 1$). The light emission wavelength can be varied by changing the molar ratio of In contained in the InGaN layer forming the light-emitting layer.

Fabrication of a light-emitting diode using the light-emitting diode substrate, may be attained by previously forming a light-emitting diode substrate comprising a combination of oxide lattice-matching with the desired semiconductor layer, and crystal-growing the desired semiconductor layer on the light-emitting diode substrate by a known method. The crystal growth method may be a liquid phase process, a vapor phase process or the like. Also, the vapor phase process may be a CVD such as MOCVD (metal-organic compound CVD), or a PVD such as sputtering. According to the production method of the light-emitting diode, a semiconductor layer containing a light-emitting layer comprising particularly a nitride-based compound represented by $In_xAl_yGa_{1-x-y}N$ (wherein $0 \leq x \leq 1$, $0 \leq y \leq 1$ and $0 \leq x+y \leq 1$) can be epitaxially grown on the substrate comprising a light-converting material capable of emitting fluorescence.

The substrate contains a plurality of oxide phases, and therefore a plurality of lattice spacings of the substrate are present every phase. In turn, the semiconductor layer can be epitaxially grown by using the region of oxide phases having good matching in the lattice spacing out of the plurality of phases on the substrate. At present GaN is epitaxially grown on an $Al_2O_3$ (sapphire) substrate belonging to the same hexagonal system and having good matching, and similarly, GaN can be epitaxially grown on the $Al_2O_3$ phase of the substrate.

EXAMPLES

Selected, representative light-emitting diodes are described in greater detail below by referring to specific examples.

Example 1

An $\alpha$-$Al_2O_3$ powder (purity: 99.99%) and a $Y_2O_3$ powder (purity: 99.999%) were weighed to give a molar ratio of 82:18 and a $CeO_2$ powder (purity: 99.99%) was weighed to have a proportion of 0.01 mol per mol of $Y_3Al_5O_{12}$ (YAG) produced by the reaction of oxides charged. These powders were wet-mixed in ethanol by a ball mill for 16 hours, and then the ethanol was removed by using an evaporator to obtain a raw material powder. This raw material powder was preliminarily melted in a vacuum furnace and used as a raw material for unidirectional solidification.

The obtained raw material was directly charged into a molybdenum crucible and after setting the crucible in a unidirectional solidification furnace, the raw material was melt-fused under a pressure of $1.33 \times 10^{-3}$ Pa ($10^{-5}$ Torr). In the same atmosphere, the crucible was moved down at a speed of 5 mm/hour, whereby a solidified body comprising a garnet-type crystal $Y_3Al_5O_{12}$:Ce and an α-type aluminum oxide crystal $Al_2O_3$ was obtained. This solidified body took on a yellow color.

Figure 3:
FIG. 3 is an electron micrograph showing one example of the texture of the light-converting material.

FIG. 3 shows a cross-sectional texture perpendicular to the solidification direction of the solidified body. The white portion is the $Y_3Al_5O_{12}$:Ce crystal and the black portion is the $Al_2O_3$ crystal. As seen in the Figure, this solidified body has a texture where two crystals are entangled with each other.

Figure 4A:
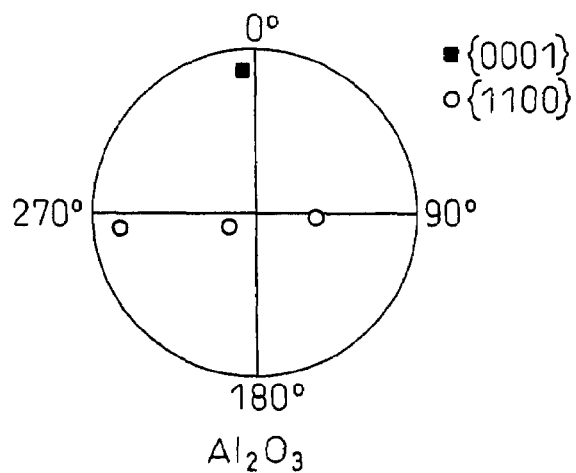
FIG. 4A and FIG. 4B are pole figures showing one example of the $Al_2O_3$ crystal orientation and the $Y_3Al_5O_{12}$:Ce crystal orientation in the light-converting material.
Figure 4B:
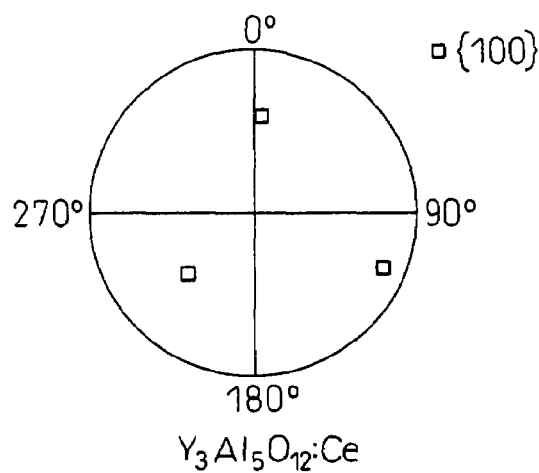

FIGS. 4A and 4B show pole figures of the $Al_2O_3$ crystal and the $Y_3Al_5O_{12}$:Ce crystal in the plane perpendicular to the solidification direction of the solidified body. As seen in these figures, the pole distribution comprises a single crystal orientation in both phases, revealing that the crystals are single crystals. Based on this result, the light-converting material substrate was cut such that the (0001) plane of the $Al_2O_3$ crystal became the main plane. Thereafter, the surface was polished and washed to obtain a light-converting material substrate having a thickness of 200 μm.

By flowing a TMG (trimethylgallium) gas, a TMA (trimethylaluminum) gas, a nitrogen gas and a dopant gas together with a carrier gas on the light-converting material substrate obtained above, a nitride-based compound semiconductor layer was formed by MOCVD method to obtain a blue light-emitting layer. An n-type nitride-based compound semiconductor and a p-type nitride-based compound semiconductor were formed by switching the dopant gas between $SiH_4$ and $Cp_2Mg$, whereby pn-junction was formed. More specifically, an n-type GaN:Si contact layer on which an n-electrode is formed, an n-type $Al_{0.5}Ga_{0.9}N$:Si layer, an n-type $In_{0.05}Ga_{0.95}N$:Si layer, an InGaN layer which forms a single quantum well structure-type light-emitting layer, a p-type $Al_{0.1}Ga_{0.9}N$:Mg barrier layer, and a p-type GaN:Mg layer on which a p-electrode is formed, are formed on the light-converting material substrate through a GaN buffer layer. After forming each of p- and n-electrodes by sputtering, the light-converting material substrate was divided by drawing a scribe line and applying external force, whereby a light-emitting diode was obtained.

Figure 5:
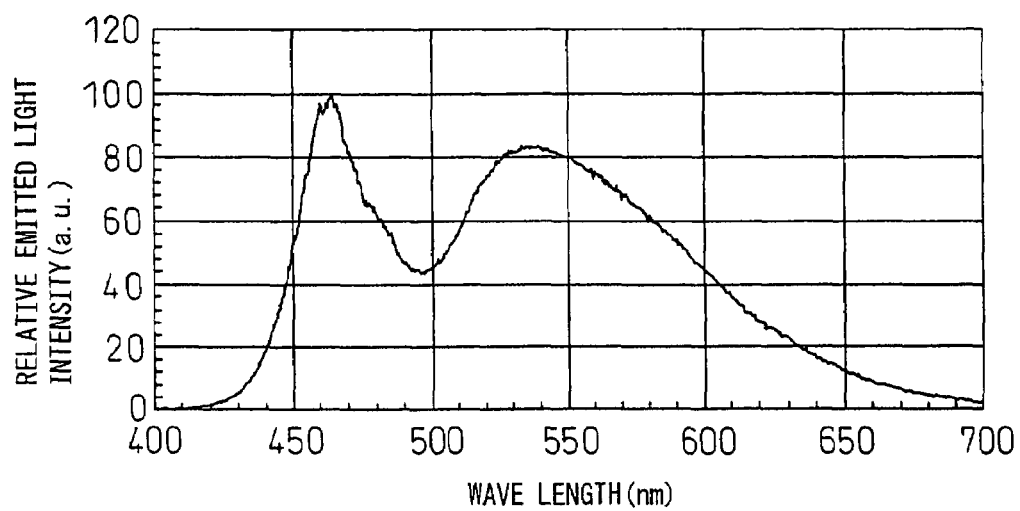
FIG. 5 is a light emission spectrum showing one example of the light-emitting diode of the present invention.

FIG. 5 shows the light emission spectrum of the obtained light-emitting diode, in which it is seen that blue light from the nitride semiconductor layer and yellow fluorescence from the light-converting material substrate excited by the blue light were mixed and a white color was obtained.

INDUSTRIAL APPLICABILITY

In the light-emitting diode using a light-converting material substrate which is the light-emitting diode substrate, a good semiconductor layer with less defects can be formed and emission of fluorescence can be performed at the same time, so that light in a color according to use can be emitted by a simple body without using another fluorescence-emitting member in combination. Also, white light can be emitted by combining the specific substrate with a nitride semiconductor layer and therefore, this diode is suitable for obtaining homogeneous white light with reduced unevenness in the color tone. Furthermore, since two or more oxide phases are formed to be continuously and three-dimensionally entangled with each other, the light in the substrate is refracted and reflected in various directions at the interface between phases differing in the refractive index and does not attenuate by causing total reflection at the inner surface and good light out-put efficiency can be obtained. In addition, the light-converting material substrate which is the light-emitting diode substrate, is composed of a ceramic composite body and the substrate can be adjusted according to various light-emitting diode semiconductors, so that a good semiconductor can be formed and a light-emitting diode excellent in light emission intensity can be provided. In this way, we provide an excellent light-emitting diode and a light-emitting diode substrate for production thereof and is useful in industry.

The invention claimed is:

1. A light-emitting diode comprising a light-converting material substrate and a semiconductor layer formed on said light-converting material substrate, wherein said light-converting material substrate comprises a solidified body formed by unidirectional solidification and consists of at least two or more single crystal oxide phases selected from a simple oxide and a complex oxide formed continuously and three-dimensionally entangled with each other, at least one oxide phase in said solidified body comprises a metal element capable of emitting fluorescence, at least one oxide in the solidified body is a non-phosphor phase and permeates light emitted from the semiconductor layer, and said semiconductor layer comprises a plurality of compound semiconductor layers and has at least a light-emitting layer capable of emitting visible light.

2. The light-emitting diode as claimed in claim 1, wherein said semiconductor layer is crystal-grown on said light-converting material substrate.

3. The light-emitting diode as claimed in claim 1, wherein said semiconductor layer is a nitride semiconductor layer.

4. The light-emitting diode as claimed in claim 3, wherein said plurality of compound semiconductor layers are nitride-based compound semiconductor layers represented by the formula: $In_xAl_yGa_{1-x-y}N$ (wherein $0 \leq x \leq 1$, $0 \leq y \leq 1$ and $0 \leq x+y \leq 1$).

5. The light-emitting diode as claimed in claim 1, wherein at least one oxide phase in said solidified body is an $Al_2O_3$ crystal phase and the main plane of said light-converting material substrate is the (0001) plane of said $Al_2O_3$ crystal.

6. The light-emitting diode as claimed in claim 1, wherein said light-converting material substrate comprises at least a cerium-activated crystal having a garnet-type structure.

7. The light-emitting diode as claimed in claim 6, wherein said garnet-type crystal is a $Y_3Al_5O_{12}$ crystal.

8. The light-emitting diode as claimed in claim 1, wherein the light-emitting layer formed in said nitride semiconductor layer emits violet or blue light.

9. The light-emitting diode as claimed in claim 1, wherein said light-emitting layer comprises InGaN.

10. The light-emitting diode as claimed in claim 1, which is a white light-emitting diode.

11. A light-emitting diode substrate for the formation of a semiconductor layer for light-emitting diodes, comprising a solidified body formed by unidirectional solidification and consists of at least two or more single crystal oxide phases selected from a simple oxide and a complex oxide formed to be continuously and three-dimensionally entangled with each other, wherein at least one oxide phase in said solidified body comprises a metal element capable of emitting fluorescence and at least one oxide in the solidified body is a non-phosphor phase and permeates light emitted from the semiconductor layer.

* * * * *